United States Patent
Maru

(10) Patent No.: US 8,988,159 B2
(45) Date of Patent: Mar. 24, 2015

(54) OSCILLATOR AND IC CHIP

(71) Applicant: Asahi Kasei Microdevices Corporation, Tokyo (JP)

(72) Inventor: Haruhiko Maru, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 15 days.

(21) Appl. No.: 13/993,490

(22) PCT Filed: Nov. 12, 2012

(86) PCT No.: PCT/JP2012/007243
§ 371 (c)(1),
(2) Date: Jun. 12, 2013

(87) PCT Pub. No.: WO2013/084411
PCT Pub. Date: Jun. 13, 2013

(65) Prior Publication Data
US 2013/0335153 A1    Dec. 19, 2013

(30) Foreign Application Priority Data

Dec. 9, 2011  (JP) ................................. 2011-270583

(51) Int. Cl.
*H03B 5/04* (2006.01)
*H03L 1/04* (2006.01)
*H03B 5/36* (2006.01)

(52) U.S. Cl.
CPC .. *H03L 1/04* (2013.01); *H03B 5/04* (2013.01); *H03B 5/36* (2013.01); *H03B 2200/0082* (2013.01)
USPC ............ 331/186; 331/70; 331/182; 331/183; 331/185

(58) Field of Classification Search
USPC .......................... 331/176, 182, 183, 185, 186
See application file for complete search history.

(56) References Cited

U.S. PATENT DOCUMENTS 5,481,229 A * 1/1996 Connell et al. ................ 331/158
5,780,955 A   7/1998 Iino et al.
(Continued)

FOREIGN PATENT DOCUMENTS

JP  63-316906 A  12/1988
JP  03-201605 A   9/1991
(Continued)

OTHER PUBLICATIONS

International Search Report dated Jan. 15, 2013, for International application No. PCT/JP20121007243.
(Continued)

*Primary Examiner* — Robert Pascal
*Assistant Examiner* — Jeffrey Shin
(74) *Attorney, Agent, or Firm* — Morgan, Lewis & Bockius LLP

(57) ABSTRACT

There is provided an oscillator capable of lowering the power supply voltage without degrading the phase noise, while employing the conventional circuit configuration. According to one aspect of the present invention, there is provided an oscillator comprising: an oscillation circuit; a bias generation circuit for generating a bias signal to drive the oscillation circuit; and a booster circuit for boosting a power supply voltage to generate a boosted voltage for driving the bias generation circuit. In addition, the oscillation circuit, the bias generation circuit, and the booster circuit are provided in a single IC chip, and the booster circuit may receive the power supply voltage VDD from the power supply arranged at the exterior of the IC chip.

13 Claims, 7 Drawing Sheets

(56) References Cited

U.S. PATENT DOCUMENTS

| | | | |
|---|---|---|---|
| 5,874,864 A * | 2/1999 | Muto et al. | 331/66 |
| 6,584,380 B1 | 6/2003 | Nemoto | |
| 8,120,437 B2 | 2/2012 | Watanabe | |
| 2010/0244968 A1 * | 9/2010 | Tsukizawa | 331/17 |

FOREIGN PATENT DOCUMENTS

| | | |
|---|---|---|
| JP | 05-259738 A | 10/1993 |
| JP | 06-152390 A | 5/1994 |
| JP | 2952815 B2 | 9/1999 |
| JP | 2000-068742 A | 3/2000 |
| JP | 3233946 B2 | 9/2001 |
| JP | 2003-174323 A | 6/2003 |
| JP | 2006-100526 A | 4/2006 |
| JP | 2010-232791 A | 10/2010 |

OTHER PUBLICATIONS

Written Opinion of the International Searching Authority dated Oct. 2, 2013, for the related international application No. PCT/JP2012/007243.

Japanese Office Action dated Mar. 11, 2014 for corresponding Japanese Patent Application No. 2013-511200.

* cited by examiner

OSCILLATOR AND IC CHIP

TECHNICAL FIELD

The present invention relates to oscillators for oscillating frequency signals and IC chips.

BACKGROUND ART

Temperature Compensated Crystal Oscillator (TCXO) enables stable output frequencies in response to changed in ambient air temperatures. Therefore, TCXO is widely used for a mobile telephone, a Personal Navigation Device (PND), and the like.

In recent years, higher functions and longer life of operable period are demanded for these devices, whereas their mounted components are required to lower the power consumption. Conventionally, the low power consumption has been promoted by sampling action of TCXO. In order to achieve further lower power consumption, however, operation of TCXO at low voltages is requested. As a conventional oscillator with such a temperature compensated crystal oscillator, there is an example of an oscillator in Patent Document 1.

FIG. 7 is a configuration diagram illustrative of main components of an oscillator described in Patent Document 1. This oscillator is formed of: an oscillation circuit 1 capable of changing the frequency depending on the voltage; and a bias generation circuit 2 for generating bias signals necessary for driving the oscillation circuit 1.

Herein, the bias generation circuit 2 corresponds to an approximate cubic function generator or the like described in Patent Document 1.

FIG. 8 is a configuration diagram illustrative of an approximate cubic function generator described in Patent Document 1. For example, in a case where an AT-cut crystal oscillator is used, its oscillation frequency has temperature characteristics approximated by a cubic function. Hence, such temperature characteristics can be cancelled by an approximate cubic function generator 21.

The approximate cubic function generator 21, upon receipt of a temperature detection value as an input signal VIN changing in a primary function manner with respect to the temperature change from a temperature detection circuit 22, generates a temperature compensation voltage (bias signal BIAS) for compensating the temperature characteristics of crystal to supply BIAS to the oscillation circuit 1. The approximate cubic function generator 21 is formed of: an adder 23; a cubic component and constant component generator 24; a primary component generator 25; and an adder circuit 26. The adder 23 adds a variable voltage V0 for adjusting the center temperature of the cubic curve to the input signal VIN, and then outputs an added output VS. The added output VS is input into the cubic component and constant component generator 24, and an output signal VAOUT is output therefrom. The added output VS is input into the primary component generator 25, and an output signal VBOUT is output therefrom. The adder circuit 26 adds the output signal VAOUT and the output signal VBOUT, and then outputs the temperature compensation voltage (bias signal BIAS). The cubic component and constant component generator 24, the primary component generator 25, and the adder circuit 26 constituting the approximate cubic function generator 21 receive supply of the power from an external power supply for supplying the power supply voltage VDD.

The bias generation circuit 2 generates the temperature compensation voltage (bias signal BIAS) for driving the oscillation circuit 1, and the reference voltage or reference current necessary for driving the oscillation circuit 1 to be supplied to the oscillation circuit 1. This allows precise compensation of the temperature characteristics of the crystal oscillator.

PRIOR ART DOCUMENTS

Patent Documents

Patent Document 1: JP 3233946 B

SUMMARY OF THE INVENTION

Problem to be Solved

In such a circuit configuration of the conventional oscillator described in Patent document 1, however, lowering of the voltage cannot be expected drastically, even if the power supply voltage is attempted to be lowered. Besides, in the circuit configuration of the conventional oscillator, even if the power supply voltage is merely lowered, the dynamic range will be narrower and the phase noise may degrade. For this reason, in the circuit configuration of the conventional oscillator, it is difficult to lower the power supply voltage. Further, such a problem is found at not only the crystal oscillator with a crystal oscillation unit but also an oscillation circuit with another oscillation device.

The present invention has been made in view of the above problem, and has an object to provide an oscillator capable of lowering the power supply voltage without degrading the phase noise, while employing the conventional circuit configuration.

Solution to the Problem

According to an aspect of the present invention, there is provided an oscillator comprising: an oscillation circuit; a bias generation circuit for generating a bias signal to drive the oscillation circuit; and a booster circuit for boosting a power supply voltage to generate a boosted voltage for driving the bias generation circuit.

With such a configuration, it is possible to lower the power supply voltage without degrading the phase noise, while employing the conventional circuit configuration.

In the above oscillator, the booster circuit may be driven by an output signal from the oscillation circuit.

This configuration brings effects that the spurious tones generated at the output voltage from the booster circuit are only integral multiples of the oscillation frequency, and non-harmonic spurious does not appear at the boosted voltage HVDD.

In the above oscillator, the bias generation circuit may comprise: a first bias generation circuit driven by the power supply voltage; a second bias generation circuit driven by the boosted voltage output from the booster circuit; and a switch unit for switching between an output from the first bias generation circuit and an output from the second bias generation circuit.

This enables the booster circuit to drive the bias generation circuit, while improving the activation characteristics of the oscillation circuit at the time of powering on.

In the above oscillator, the first bias generation circuit may be an oscillation promoting bias generation circuit for promoting oscillation, and the second bias generation circuit may be a normal operation bias generation circuit for performing a normal operation.

The above oscillator may further comprise a control circuit for controlling a switching operation of the switch unit.

In the above oscillator, the control circuit may determine whether or not the boosted voltage output from the booster circuit is a predefined voltage, and when the boosted voltage is the predefined voltage, the control circuit may output a control signal for performing the switching operation at the switch unit.

With such a configuration, it is made possible to activate the oscillation circuit within a minimum period and in a stable manner.

In the above oscillator, the bias generation circuit may be a temperature compensation circuit.

In the above oscillator, the bias signal may include a temperature compensation voltage.

In the above oscillator, the bias signal may be supplied as a control voltage of a voltage variable capacitative element in the oscillation circuit.

In the above oscillator, the bias generation circuit may be a circuit for generating a reference voltage or a reference current necessary for driving the oscillation circuit.

In the above oscillator, the bias signal may include the reference voltage or the reference current necessary for driving the oscillation circuit.

In the above oscillator, the bias signal may be supplied as a reference of oscillator current in the oscillation circuit.

In the above oscillator, the bias generation circuit may be a memory circuit for storing a temperature compensation parameter.

According to an aspect of the present invention, there is provided an IC chip comprising: an oscillation circuit; a bias generation circuit for generating a bias signal to drive the oscillation circuit; a booster circuit for boosting a power supply voltage and driving the bias generation circuit; a power supply terminal for receiving supply of the power from an external power supply for supplying the power supply voltage; an oscillation unit terminal for connecting an oscillation unit controlled by the oscillation circuit and the oscillation circuit; a ground terminal for ground connection; and an output terminal for outputting an output signal from the oscillation circuit.

In such a configuration, the oscillation circuit is mounted in a single IC chip, receives the power supply voltage from a power supply at the exterior of the IC chip, and boosts the power supply voltage at the booster circuit in the IC chip. Therefore, when the power supply arranged on the mounted substrate or another IC chip, it is possible to manufacture the power supply or the IC chip without consideration of the influence on the oscillation circuit caused by the decrease in the power supply voltage of the power supply provided at the exterior of the IC chip.

Advantageous Effects of the Invention

According to one aspect of the present invention, it is possible to lower the power supply voltage without degrading the phase noise, while employing the conventional circuit configuration.

DESCRIPTION OF EMBODIMENTS

Figure 1:
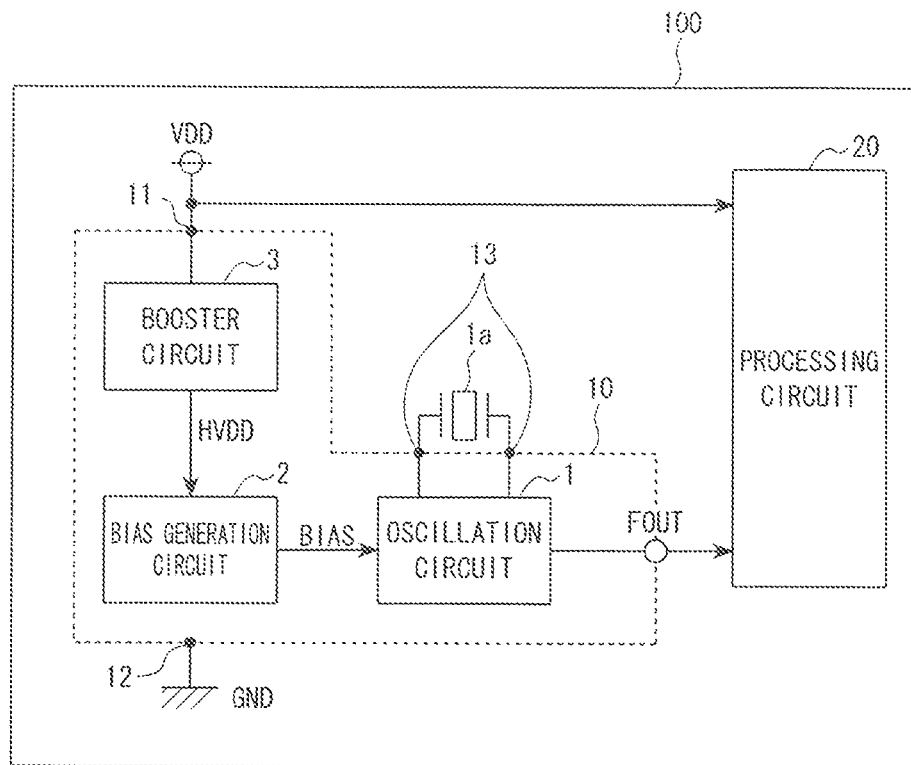
FIG. 1 is a block diagram illustrative of a configuration example of a crystal oscillator according to a first embodiment of the present invention.

Hereinafter, embodiments of the present invention will be described with reference to the drawings. In each of the drawings to be referred to in the following description, the same components and configurations have the same reference numerals in the drawings.

First Embodiment

FIG. 1 is a block diagram illustrative of a configuration example of a crystal oscillator according to a first embodiment of the present invention. FIG. 1 illustrates a case where a crystal oscillator (an oscillator) according to the first embodiment is mounted on an IC chip 10 and located on a mounted substrate 100 in an electronic device. In addition to IC chip 10, an IC chip 20 having a processing circuit mounted thereon is located on the mounted substrate 100. The processing circuit of the IC chip 20 receives an output frequency from the crystal oscillator of the IC chip 10 to perform processing of an input/output device or the like. Further, in FIG. 1, a crystal oscillation unit 1a is located on the mounted substrate 100 and arranged at the exterior of the IC chip 10. However, the IC chip 10 and the crystal oscillation unit 1a may be mounted in an identical module.

Figure 7:
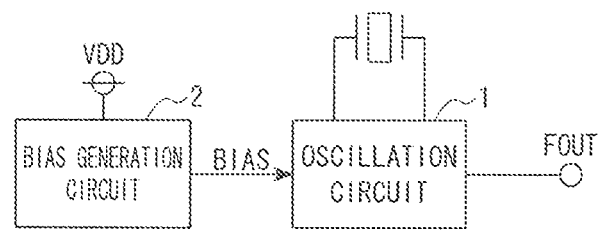
FIG. 7 is a configuration diagram illustrative of main components of an oscillator described in Patent Document 1.
Figure 8:
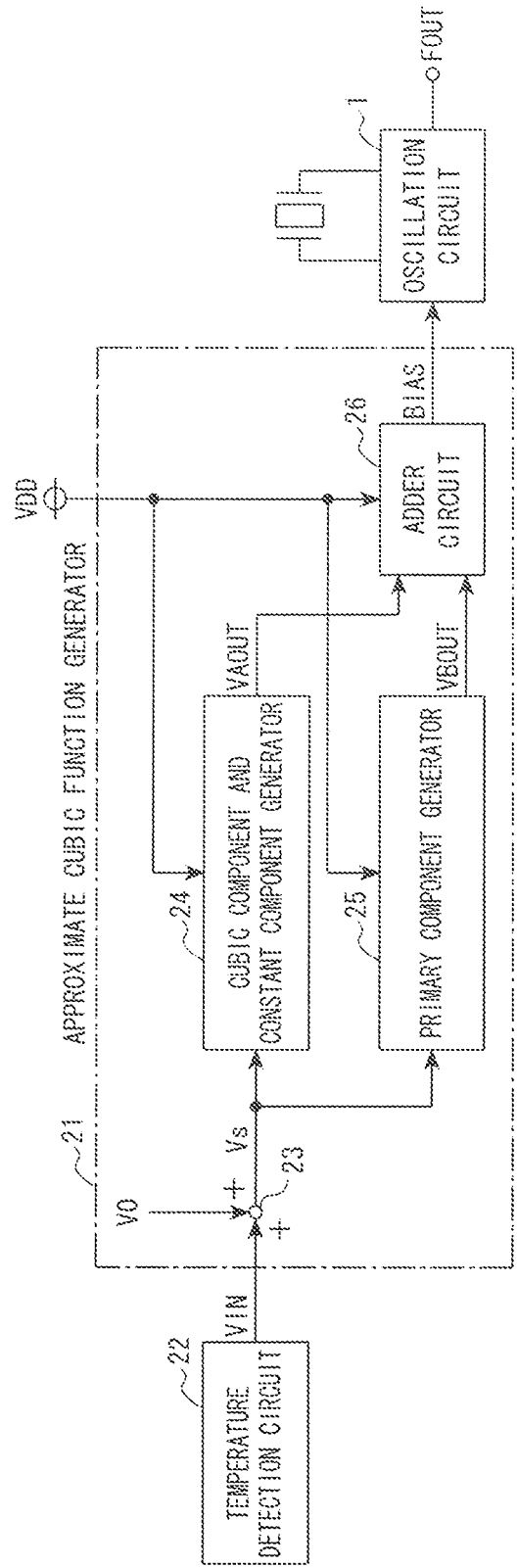
FIG. 8 is a configuration diagram illustrative of an approximate cubic function generator described in Patent Document 1.

The crystal oscillator according to the first embodiment mounted on the IC chip 10 is provided with: an oscillation circuit 1 for applying voltage to the crystal oscillation unit 1a; a bias generation circuit 2 for generating the bias signal BIAS necessary for the oscillation circuit 1; and a booster circuit 3. Herein, the booster circuit 3 is a circuit for driving the bias generation circuit 2. Specifically, the oscillation circuit 1 and the bias generation circuit 2 are respectively same with those of FIG. 7.

In this situation, the oscillation circuit 1, the bias generation circuit 2, and the booster circuit 3 are mounted in the IC chip 10. In addition, the IC chip 10 is further provided with: a power supply terminal 11 for receiving the supply of the power supply voltage VDD from an external power supply; a ground terminal 12 for ground connection; oscillation unit terminals 13 for connecting the crystal oscillation unit 1a and the oscillation circuit 1; and an output terminal FOUT for outputting the output frequency from the oscillation circuit 1 to the exterior of the IC chip 10.

The bias generation circuit 2 may be realized by, for example, a temperature compensation circuit constituted by the approximate cubic function generator or the like described in Patent Document 1, may be realized by a circuit for generating the reference voltage or the reverence current necessary for driving the oscillation circuit 1, or may be realized by a memory circuit or the like for storing temperature compensation parameters.

The bias signal BIAS output from the bias generation circuit 2 is, for example, a bias signal BIAS including the temperature compensation voltage, in the case of TCXO. Then, the bias signal BIAS is supplied as a control voltage of a voltage variable capacitative element in the oscillation circuit 1 so as to be capable of controlling the oscillation frequency arbitrarily and compensating the temperature characteristics of crystal.

Further, the bias signal BIAS output from the bias generation circuit 2 is, for example, a bias signal BIAS including the reference voltage or the reference current necessary for driving the oscillation circuit 1, in the case of a Simple Packaged Crystal Oscillator (SPXO). Then, the bias signal BIAS is supplied as a reference of the oscillator current in the oscillation circuit 1 so as to provide good variations of the oscillation frequency due to the variations of the power supply voltage VDD.

Moreover, the booster circuit 3 is a circuit for boosting the power supply voltage to generate a boosted voltage HVDD that is a voltage higher than the power supply voltage VDD. The bias generation circuit 2 is driven by the boosted voltage HVDD. That is to say, as the crystal oscillator according to the first embodiment is provided with the booster circuit 3, the bias generation circuit 2 can be driven by the boosted voltage HVDD even if the power supply voltage VDD is low. This enables the use of the conventional circuit configuration without change, and also enables the prevention of the phase noise, because the dynamic range in the bias generation circuit 2 will not be narrowed. In this manner, the present invention is useful regardless of the type of the bias generation circuit included in the crystal oscillator.

Additionally, the IC chip 10 on which the crystal oscillator is mounted and other elements (such as the power supply, the IC chip 20, and the like) are respectively manufactured by different manufacturers, in some cases. In such cases, as illustrated in FIG. 1, as far as the crystal oscillator is mounted in a single IC chip 10 (that is, as far as the booster circuit 3 is provided in the IC chip 10), even in a case where the power supply voltage VDD is set to be low for saving the electric power of an electronic device, the manufacturer that manufactures the power supply, the IC chip 20, or the like are able to manufacture the power supply, the IC chip 20, or the like without considering the influence of the electric power saving on the crystal oscillator.

Further, the clock necessary for operating the booster circuit 3 can be input from the exterior of the IC chip 10. In these years, however, downsizing of the crystal oscillators is progressing and the number of pins has limitations. Therefore, the crystal oscillator provided with an RC circuit and the like is built in the IC chip 10, so that the crystal oscillator according to the first embodiment can be realized without increasing the number of pins.

In addition, the bias generation circuit 2 may include a circuit for generating a temperature compensation signal for compensating the temperature characteristics of the output frequency, and the temperature compensation signal may be supplied to the oscillation circuit 1, as the bias signal BIAS. Furthermore, in the bias generation circuit 2, all circuits constituting the bias generation circuit 2 are not necessarily driven by the boosted voltage HVDD, and a part of the circuits may be driven by the power supply voltage VDD.

Second Embodiment

Figure 2:
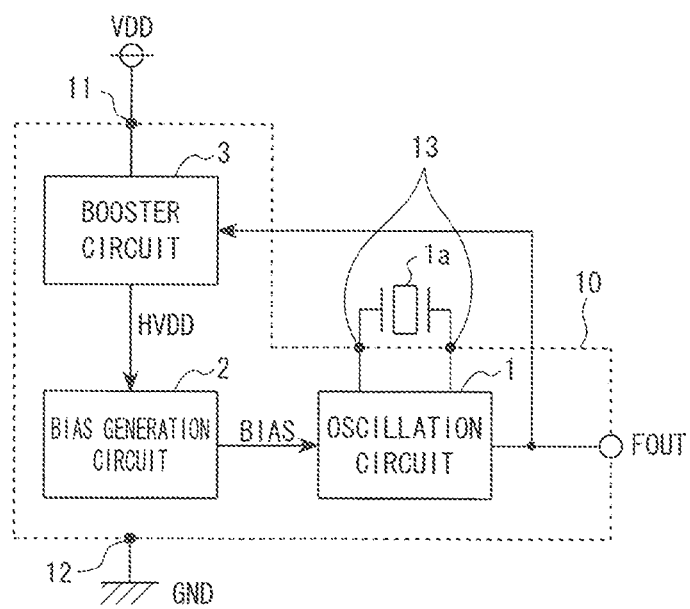
FIG. 2 is a block diagram illustrative of a configuration example of a crystal oscillator according to a second embodiment of the present invention.

FIG. 2 is a block diagram illustrative of a configuration example of a crystal oscillator according to a second embodiment of the present invention. In FIG. 2, the configuration other than the IC chip 10 on the mounted substrate 100 is omitted, and only the configuration of the IC chip 10 on which the crystal oscillator is mounted is illustrated (this applies to other embodiments). The crystal oscillator according to the second embodiment illustrated in FIG. 2 has a substantially similar configuration to that of the crystal oscillator according to the first embodiment, but has a different configuration in that the booster circuit 3 is driven by an output signal from the oscillation circuit 1.

That is, the booster circuit 3 performs a boosting operation with the output signal from the oscillation circuit 1 as a clock. Thus, spurious tones generated at the output voltage (boosted voltage HVDD) from the booster circuit 3 are only integral multiples of the oscillation frequency, and non-harmonic spurious does not appear at the boosted voltage HVDD.

In this situation, the harmonic spurious of an integral multiple of the oscillation frequency caused by the output waveform (such as rectangle, clipped sine, or the like) is originally existent at the output terminal FOUT. Therefore, even if the above-described spurious tones are generated at the output from the booster circuit 3, it doesn't become a problem. For example, when the booster circuit 3 is driven by an RC oscillation circuit, the output frequency from the RC oscillation circuit is sometimes generated at the output terminal FOUT as a spurious component. Moreover, non-harmonic spurious will be generated at various frequency bands, by mixing the output frequency of the RC oscillation circuit with the oscillation frequency of the oscillation circuit 1. The crystal oscillator according to the second embodiment, however, is capable of avoiding these problems.

Third Embodiment

Figure 3:
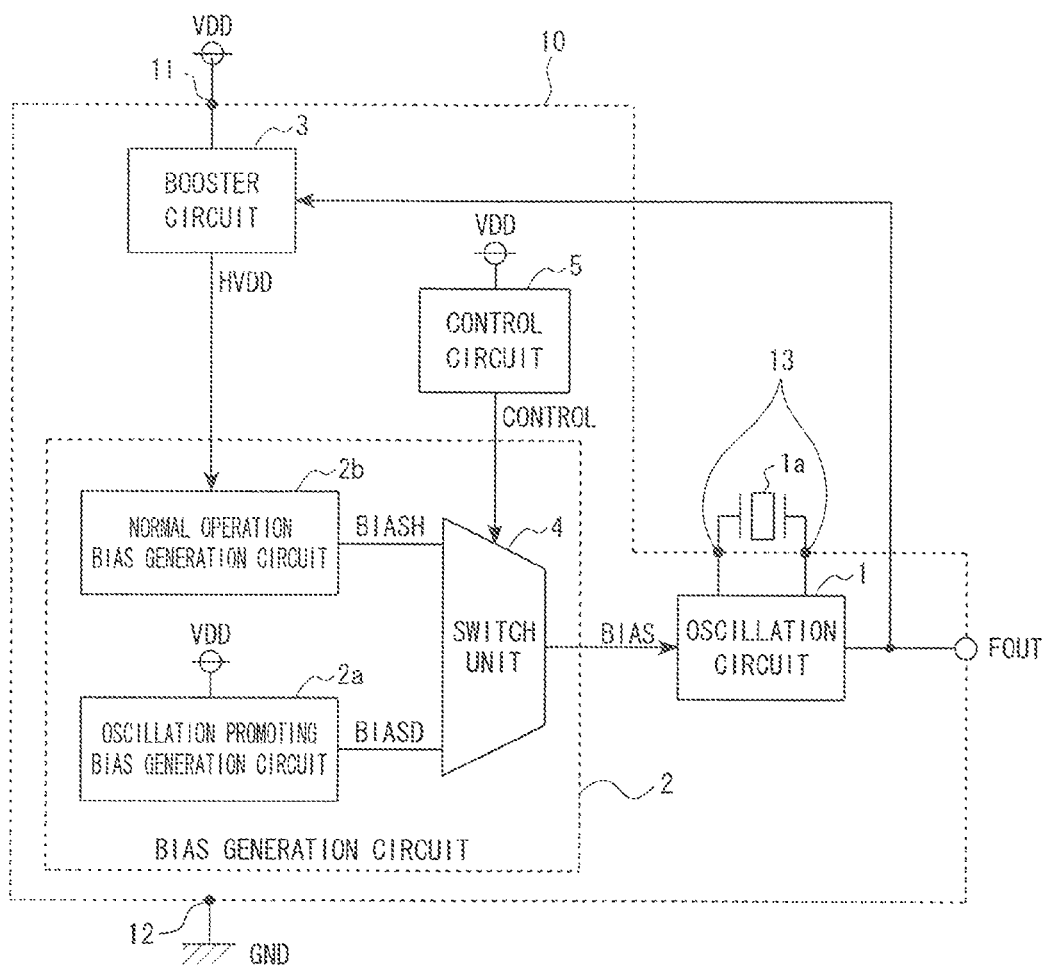
FIG. 3 is a block diagram illustrative of a configuration example of a crystal oscillator according to a third embodiment of the present invention.

FIG. 3 is a block diagram illustrative of a configuration example of a crystal oscillator according to a third embodiment of the present invention. Referring to FIG. 3, the bias generation circuit 2 constituting the crystal oscillator according to the third embodiment is provided with: an oscillation promoting bias generation circuit 2a (a first bias generation circuit); a normal operation bias generation circuit 2b (a second bias generation circuit); and a switch unit 4. Additionally, the crystal oscillator according to the third embodiment includes a control circuit 5 for controlling the switch unit 4.

The oscillation promoting bias generation circuit 2a is driven by the power supply voltage VDD to output bias BIASD such that the negative resistance of the crystal oscillator is improved to promote the oscillation. On the other hand, the normal operation bias generation circuit 2b is driven by the boosted voltage HVDD to output bias BIASH such that the crystal oscillator performs a normal operation. The "normal operation" herein means, for example, a state where the temperature compensation is done in the case of TCXO to output a predefined oscillation frequency.

Furthermore, the control circuit 5 outputs a control signal CONTROL to the switch unit 4. The switch unit 4, in response to the control signal CONTROL, switches between the bias BIASD output from the oscillation promoting bias generation circuit 2a and the bias BIASH output from the normal operation bias generation circuit 2b.

Figure 4:
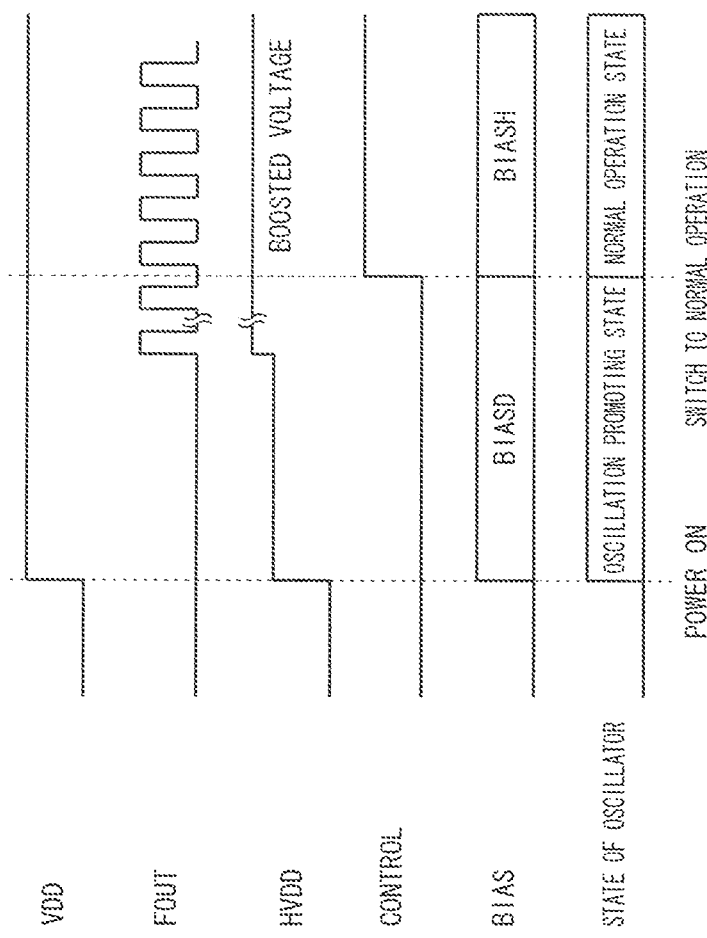
FIG. 4 is a timing chart illustrative of an operation example of the crystal oscillator according to the third embodiment of the present invention.

FIG. 4 is a timing chart illustrative of an operation example of the crystal oscillator according to the third embodiment of the present invention. Referring to FIG. 4, almost at the same time with the power on (rising of the power supply voltage VDD), the bias BIASD output from the oscillation promoting bias generation circuit 2a is input into the oscillation circuit 1 as the bias signal BIAS, and an oscillation promoting state of promoting the oscillation operation of the crystal oscillator is achieved. When the oscillation operation starts and the clock is output to the output terminal FOUT, the booster circuit 3 operates and the boosted voltage HVDD is risen. Subsequently, the bias BIASD and the bias BIASH are switched by the control signal CONTROL of the control circuit 5, so that the crystal oscillator shifts to the normal operation state.

As described above, in the crystal oscillator according to the third embodiment, it is made possible for the booster circuit 3 to drive the bias generation circuit 2, while improving the activation characteristics of the crystal oscillator at the time of powering on. Specifically, the control circuit 5, by being constituted by a timer circuit or the like, may perform a time constant control operation.

Fourth Embodiment

Figure 5:
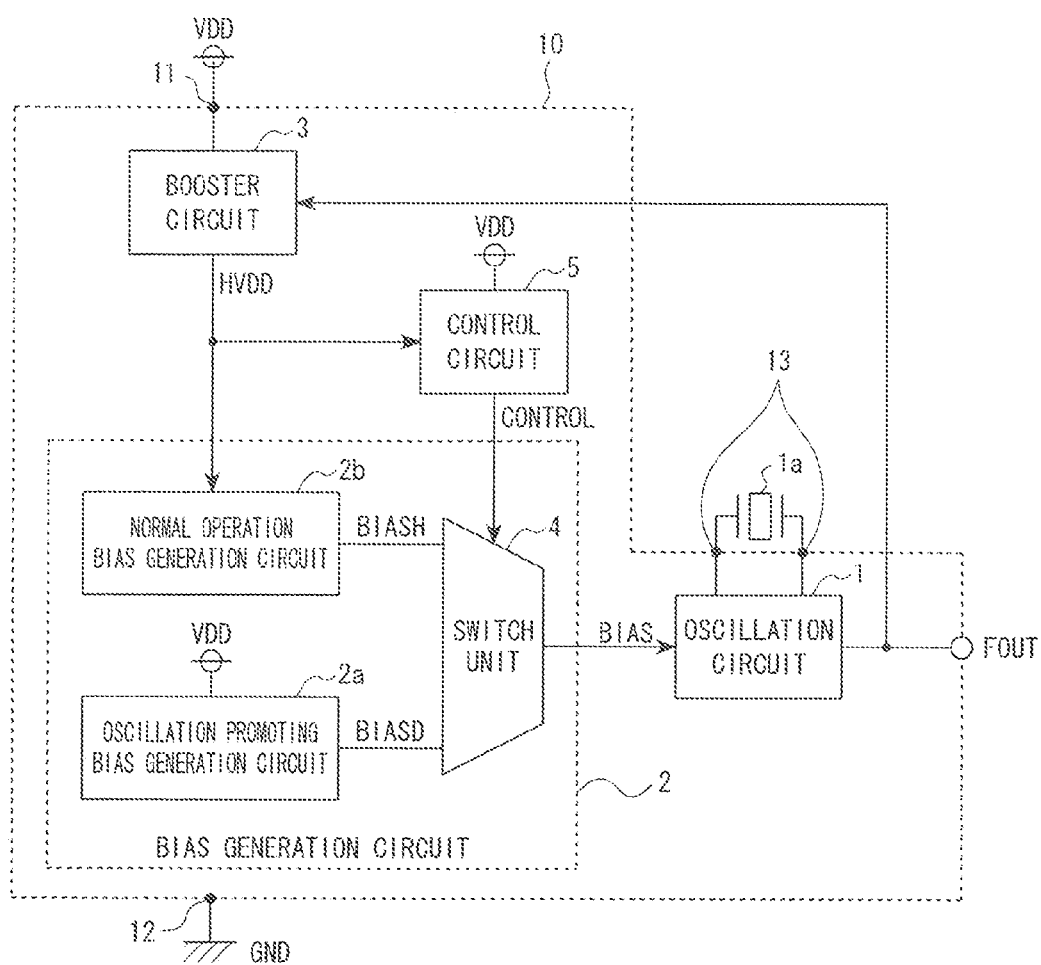
FIG. 5 is a block diagram illustrative of a configuration example of a crystal oscillator according to a fourth embodiment of the present invention.

FIG. 5 is a block diagram illustrative of a configuration example of a crystal oscillator according to a fourth embodiment of the present invention. The crystal oscillator according to the fourth embodiment illustrated in FIG. 5 has a substantially similar configuration to that of the crystal oscillator according to the third embodiment (in FIG. 3). The crystal oscillator, however, has a different configuration from that of FIG. 3 in that the control circuit 5 controls the switch unit 4 based upon the output voltage (the boosted voltage HVDD) from the booster circuit 3 so as to perform a bias switching operation.

When the boosted voltage HVDD output from the booster circuit 3 is lower than a predefined voltage Vth, the operation of the normal operation bias generation circuit 2b is sometimes unstable. In an unstable operation of the normal operation bias generation circuit 2b, when the bias BIASH is applied to the oscillation circuit 1 as the bias signal BIAS, the negative resistance may degrade to delay the activation time, resulting in oscillation stop. For this reason, it is desirable that the switching operation at the switch unit 4 should be performed at a timing when the boosted voltage HVDD is equal to or higher than the predefined voltage Vth.

Figure 6:
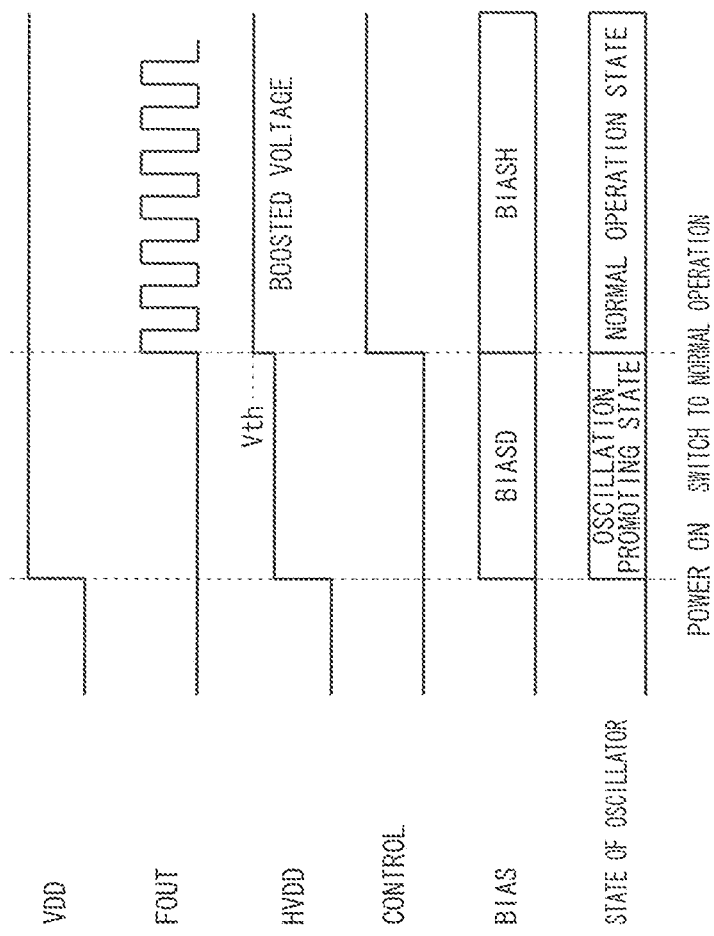
FIG. 6 is a timing chart illustrative of an operation example of the crystal oscillator according to the fourth embodiment of the present invention.

FIG. 6 is a timing chart illustrative of an operation example of the crystal oscillator according to the fourth embodiment of the present invention. As illustrated in FIG. 4, when the oscillation operation starts and the clock is output to the output terminal FOUT, the booster circuit 3 operates and the boosted voltage HVDD rises. In the crystal oscillator according to the fourth embodiment, subsequently, when the control circuit 5 detects that the boosted voltage HVDD becomes the predefined voltage Vth, the control circuit 5 outputs the control signal CONTROL to the switch unit 4. Then, with the control signal CONTROL, the switch unit 4 switches the bias signal BIAS to be output to the oscillation circuit 1 from the bias BIASD to the bias BIASH.

As described above, in the crystal oscillator according to the fourth embodiment, the control circuit 5 determines whether or not the boosted voltage HVDD of the booster circuit 3 is the predefined voltage Vth. When the output voltage HVDD is the predefined voltage Vth, the control signal CONTROL is output to the switch unit 4. The switch unit 4, upon receipt of the control signal CONTROL, performs a switching operation of switching the bias signal BIAS to be output to the oscillation circuit 1 from the bias BIASH to bias BIASD. This makes it possible to activate the crystal oscillator within a minimum period and in a stable manner. To be specific, the predefined voltage Vth may include hysteresis when the power supply voltage VDD rises or falls.

Additionally, in each embodiment of the present invention described above, the crystal oscillator has been described as an example of oscillator. However, the oscillation device of the oscillator is not limited to the crystal oscillation unit. For example, in place of the crystal oscillation unit, a Surface Acoustic Wave (SAW) oscillator, Bulk Acoustic Wave (BAW) oscillator, Micro Electro Mechanical Systems (MEMS), ceramic oscillator, or the like may be employed. The above oscillators will bring similar effects.

Heretofore, embodiments of the present invention have been described. The scope of the present invention, however, is not limited to the exemplary embodiments illustrated and described in the drawings, but may include all embodiments that will bring equivalent effects intended by the present invention. Furthermore, the scope of the present invention may be defined by any desired combination of specific ones of all the features described herein.

REFERENCE SIGNS LIST 1 oscillation circuit
1a crystal oscillation unit
2 bias generation circuit
2a oscillation promoting bias generation circuit
2b normal operation bias generation circuit
3 booster circuit
4 switch unit
5 control circuit (crystal oscillator)
10 IC chip
11 power supply terminal
12 ground terminal
13 oscillation unit terminal
20 IC chip (processing circuit)
21 approximate cubic function generator
100 mounted substrate
BIAS bias signal
BIASH bias signal for normal operation
BIASD bias signal for promoting oscillation
CONTROL control signal
FOUT output terminal
VDD power supply voltage
HVDD boosted voltage
Vth predefined voltage

The invention claimed is:

1. An oscillator comprising:
an oscillation circuit;
a bias generation circuit for generating a bias signal to drive the oscillation circuit; and
a booster circuit for boosting a power supply voltage to generate a boosted voltage for driving the bias generation circuit,
wherein the bias generation circuit comprises:
a first bias generation circuit driven by the power supply voltage;
a second bias generation circuit driven by the boosted voltage output from the booster circuit; and
a switch unit for switching between an output from the first bias generation circuit and an output from the second bias generation circuit.

2. The oscillator according to claim 1, wherein the booster circuit is driven by an output signal from the oscillation circuit.

3. The oscillator according to claim 1,
wherein the first bias generation circuit is an oscillation promoting bias generation circuit for promoting oscillation, and
the second bias generation circuit is a normal operation bias generation circuit for performing a normal operation.

4. The oscillator according to claim 1, further comprising a control circuit for controlling a switching operation of the switch unit.

5. The oscillator according to claim 4, wherein the control circuit determines whether or not the boosted voltage output from the booster circuit is a predefined voltage, and when the boosted voltage is the predefined voltage, the control circuit outputs a control signal for performing the switching operation at the switch unit.

6. The oscillator according to claim 1, wherein the bias generation circuit is a temperature compensation circuit.

7. The oscillator according to claim 6, wherein the bias signal includes a temperature compensation voltage.

8. The oscillator according to claim 7, wherein the bias signal is supplied as a control voltage of a voltage variable capacitative element in the oscillation circuit.

9. The oscillator according to claim 1, wherein the bias generation circuit is a circuit for generating a reference voltage or a reference current necessary for driving the oscillation circuit.

10. The oscillator according to claim 9, wherein the bias signal includes the reference voltage or the reference current necessary for driving the oscillation circuit.

11. The oscillator according to claim 10, wherein the bias signal is supplied as a reference of oscillator current in the oscillation circuit.

12. The oscillator according to claim 1, wherein the bias generation circuit is a memory circuit for storing a temperature compensation parameter.

13. An IC chip comprising:
an oscillation circuit;
a bias generation circuit for generating a bias signal to drive the oscillation circuit;
a booster circuit for boosting a power supply voltage and driving the bias generation circuit;
a power supply terminal for receiving supply of the power from an external power supply for supplying the power supply voltage;
an oscillation unit terminal for connecting an oscillation unit controlled by the oscillation circuit and the oscillation circuit;
a ground terminal for ground connection; and
an output terminal for outputting an output signal from the oscillation circuit;
wherein the bias generation circuit comprises:
a first bias generation circuit driven by the power supply voltage;
a second bias generation circuit driven by the boosted voltage output from the booster circuit; and
a switch unit for switching between an output from the first bias generation circuit and an output from the second bias generation circuit.

* * * * *